US006896572B2

(12) United States Patent
Park et al.

(10) Patent No.: US 6,896,572 B2
(45) Date of Patent: May 24, 2005

(54) METHOD FOR ENCAPSULATING ORGANIC ELECTROLUMINESCENT DEVICE AND AN ORGANIC ELECTROLUMINESCENT PANEL USING THE SAME

(75) Inventors: Jin-Woo Park, Yongin (KR); Seung-Yong Song, Seoul (KR)

(73) Assignee: Samsung SDI Co., Ltd., Suwon (KR)

( * ) Notice: Subject to any disclaimer, the term of this patent is extended or adjusted under 35 U.S.C. 154(b) by 40 days.

(21) Appl. No.: 10/430,317

(22) Filed: May 7, 2003

(65) Prior Publication Data

US 2003/0218422 A1 Nov. 27, 2003

(30) Foreign Application Priority Data

May 23, 2002 (KR) ......................................... 2002-28714

(51) Int. Cl.[7] .............................................. H01J 9/26
(52) U.S. Cl. ........................................ 445/25; 445/24
(58) Field of Search ............................. 445/24, 25, 43, 445/44; 313/512, 493, 634, 635, 504

(56) References Cited

U.S. PATENT DOCUMENTS 6,777,870 B2 * 8/2004 Sundahl ..................... 313/504

2003/0011737 A1 * 1/2003 Matsuoka ................... 349/153
2003/0017777 A1 * 1/2003 Matsuoka et al. ............ 445/24
2003/0122476 A1 * 7/2003 Wang et al. ................ 313/493
2004/0032209 A1 * 2/2004 Wu et al. .................... 313/512

FOREIGN PATENT DOCUMENTS

| JP | 2001297878 | 10/2001 | ........... H05B/33/10 |
| JP | 2002008853 | 1/2002 | ........... H05B/33/04 |

* cited by examiner

*Primary Examiner*—Joseph Williams
*Assistant Examiner*—Glenn Zimmerman
(74) *Attorney, Agent, or Firm*—McGuireWoods LLP

(57) ABSTRACT

A method of encapsulating an organic electroluminescent (EL) device. The method includes applying a first sealant to a portion of an encapsulation plate facing a substrate to define one selected from a plurality of organic EL devices formed on the substrate, each including a first electrode layer, organic layers, and a second electrode layer. A space produced by the encapsulation plate and the first sealant and having an open face is filled with a second sealant. The substrate and the encapsulation plate are bonded together by applying pressure. The first sealant and the second sealant are then cured. The substrate and the encapsulation plate are cut into a plurality of independent organic EL panels.

16 Claims, 7 Drawing Sheets

UV OR HEAT

UV OR HEAT

METHOD FOR ENCAPSULATING ORGANIC ELECTROLUMINESCENT DEVICE AND AN ORGANIC ELECTROLUMINESCENT PANEL USING THE SAME

CROSS REFERENCE

This application claims the benefit of Korean Patent Application No. 2002-0028714, filed on May 23, 2002, which is hereby incorporated by reference for all purposes as if fully set forth herein.

BACKGROUND OF THE INVENTION

1. Field of the Invention

The present invention relates to an organic electroluminescent device, and more particularly, to an encapsulation method of an organic electroluminescent device by which the organic electroluminescent device is protected from moisture and oxygen infiltration, and an organic electroluminescent panel using the same.

2. Description of the Related Art

Recently, attention has been given to electroluminescent display devices as spontaneous emission display devices because they have advantageous features suitable for the next generation display devices, such as a wide viewing angle, a high contrast ratio and a high response speed. Electroluminescent display devices are classified into inorganic electroluminescent display devices and organic electroluminescent display devices according to materials used to form the emitter layers. Organic electroluminescent display devices are in widespread use and exhibit luminance, a low driving voltage and a high response speed.

A general organic electroluminescent display device (hereinafter abbreviated as an organic EL device) is basically configured such that a first electrode layer with a predetermined pattern is formed on a substrate. A hole transport layer, a light emitting layer and an electron transport layer are sequentially stacked on the first electrode. A second electrode layer with a predetermined pattern is formed on the electron transport layer in a direction orthogonal to the first layer. The hole transport layer, the light emitting layer and the electron transport layer are organic layers made from organic compounds. To drive the organic EL device having the above-described configuration, a predetermined voltage is applied between the first electrode and the second electrode. Holes injected from the first electrode move to the light emitting layer via the hole transport layer and electrons from the second electrode are injected into the light emitting layer via the electron transport layer. The electrons and holes are recombined at the light emitting area to generate excitons. The generated excitons de-excite from an excited state to a base state so that fluorescent molecules of the light emitting layer emit light, thereby forming an image.

The organic layers made from organic compounds having low heat resistance are succeptible to deterioration due to moisture, and the second electrode formed on the organic layers may experience deterioration in performance. As a result, when the organic EL device is driven in the presence of air, the electroluminescent characteristics sharply degrade. Thus, in order to obtain an efficient organic EL device, it is necessary to protect the organic layers against exposure to moisture or oxygen by encapsulating the organic layers of the EL device. In order to maintain good performance of an organic EL device, improved encapsulation methods have recently been the subject of active research.

FIG. 1 is a longitudinal cross-sectional view illustrating a conventional method of encapsulating an organic EL device.

Referring to FIG. 1, an organic EL device 30 including a first electrode layer 31, a hole transport layer 32, a light emitting layer 33, an electron transport layer 34 and a second electrode layer 35, is formed on a substrate 10. A box-shaped or dome-shape encapsulation cap 21 having a moisture absorbent layer 41 installed on its internal surface and having an open face, is adhered to the substrate 10 by an adhesive layer 50 in a state in which the organic EL device 30 is positioned on its internal surface. Since only the adhesive layer 50 is used to prevent infiltration of moisture or oxygen, there is a limit to optionally protecting the organic EL device 30 against moisture or oxygen. In order to effectuate good encapsulating capacity of the organic EL device 30 by isolating the same from moisture or oxygen, a cavity 21a defined by the substrate 10 and the encapsulation cap 21 is filled with oxygen- or moisture-free nitrogen such that the pressure of the cavity 21a is higher than atmospheric pressure. This approach, however, involves several problems including an increase in cost, poor manufacturability and increased defect ratio.

FIG. 2 is a longitudinal cross-sectional view illustrating another conventional method of encapsulating an organic EL device 30.

As shown in FIG. 2, an adhesive resin layer 42 is coated on the surface of the organic EL device 30 formed on a substrate 10. An encapsulation plate 22 covers the adhesive resin layer 42 to encapsulate the organic EL device 30. Where the adhesive resin layer 42 is applied to a plurality of organic EL devices, it is difficult to apply the adhesive resin layer 42 to the desired portions only. Accordingly, the adhesive resin layer 42 is often erroneously coated on electrodes 31 and 35 which are to be exposed to the outside and not encapsulated. In this event, it is necessary to remove the coated adhesive resin layer 42 to expose the erroneously coated electrodes 31 and 35. This process results in poor manufacturability and increases the defect ratio for the product. Another problem with this method is that the adhesion process may produce between the adhesive resin layer 42 and the encapsulation layer 22, and which, deteriorates the performance of the organic EL device 30.

SUMMARY OF THE INVENTION

To solve the above-described problems, the present invention provides an encapsulating method of an organic EL device, which allows mass production, increases manufacturability and reduces a defect ratio, by effectively encapsulating the organic EL device against external moisture or oxygen.

In an embodiment of the present invention, a method of encapsulating an organic EL device comprises steps of applying a first sealant to a portion of an encapsulation plate facing a substrate that defines one selected from a plurality of organic EL devices formed on the substrate. The EL device includes a first electrode layer, an organic layer, and a second electrode layer. A space produced by the encapsulation plate and the first sealant and having an open face. A second sealant is located in the space produced by the encapsulation plate and the first sealant. The substrate and the encapsulation plate are bonded to each other by applying pressure such that the first sealant and second sealant bond the substrate and the encapsulation plate to each other. The first sealant and the second sealant are cured. The substrate and the encapsulation plate are then cut so as to form a plurality of independent organic EL panels.

In another aspect of the present invention, an organic EL panel comprises a substrate, an organic EL device. The organic EL device is formed on the substrate and includes a first electrode layer, an organic layer, and a second electrode layer. The organic EL panel also has an encapsulation plate formed over the organic EL device, a first sealant interposed between the substrate and the encapsulation plate. The first sealant surrounds the outer periphery of the organic EL device and a second sealant fills into a space produced by the substrate, the first sealant and the encapsulation plate.

BRIEF DESCRIPTION OF THE DRAWING

These and other objects and advantages of the present invention will become apparent and more readily appreciated from the following description of the embodiments, taken in conjunction with the accompanying drawings.

DETAILED DESCRIPTION OF THE INVENTION

Reference will now be made in detail to the embodiments of the present invention, examples of which are illustrated in the accompanying drawings. FIGS. 3A through 3F are longitudinal cross-sectional views illustrating a method of encapsulating an organic EL device according to one example of the present invention.

Figure 1:
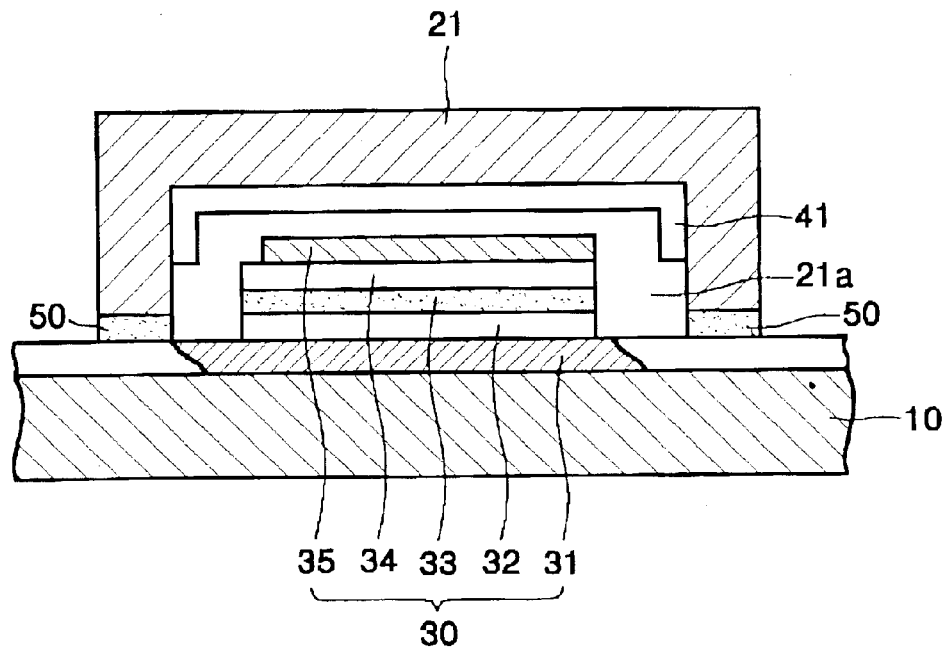
FIGS. 1 and 2 are longitudinal cross-sectional views illustrating conventional encapsulated organic EL devices.
Figure 2:
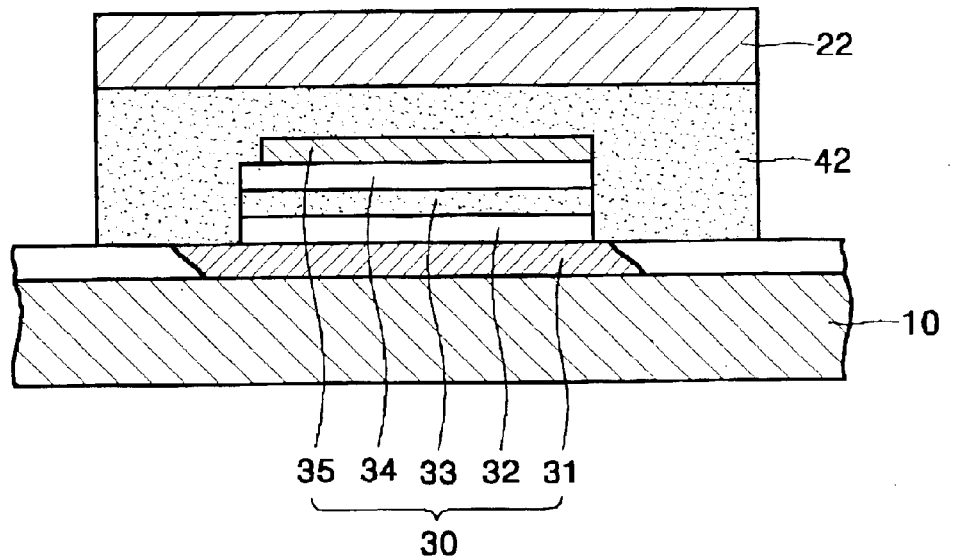
Figure 3A:
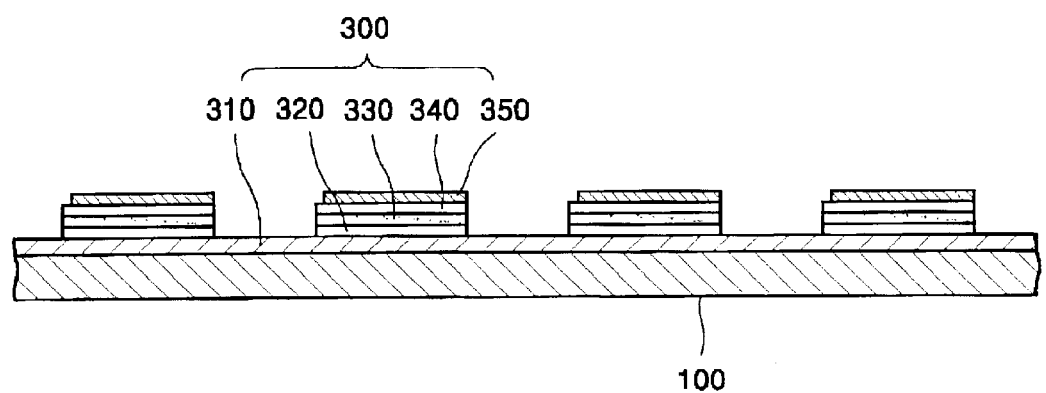
FIGS. 3A through 3F are longitudinal cross-sectional views illustrating a method for encapsulating an organic EL device according to a first embodiment of the present invention.

Referring to FIG. 3A, a plurality of organic EL devices 300 each including a first electrode layer 310, organic layers 320, 330 and 340, and a second electrode layer 350 are formed on a substrate 100. The organic EL device 300 is formed by sequentially stacking organic materials and electrode materials on the substrate 100. Here, the organic layers 320, 330 and 340 represent a hole transport layer, a light emitting layer and an electron transport layer, respectively. However, the hole transport layer 320 and the light emitting layer 330, or the light emitting layer 330 and the electron transport layer 340, may be integrally formed, and are not limited to the above examples.

Figure 3B:
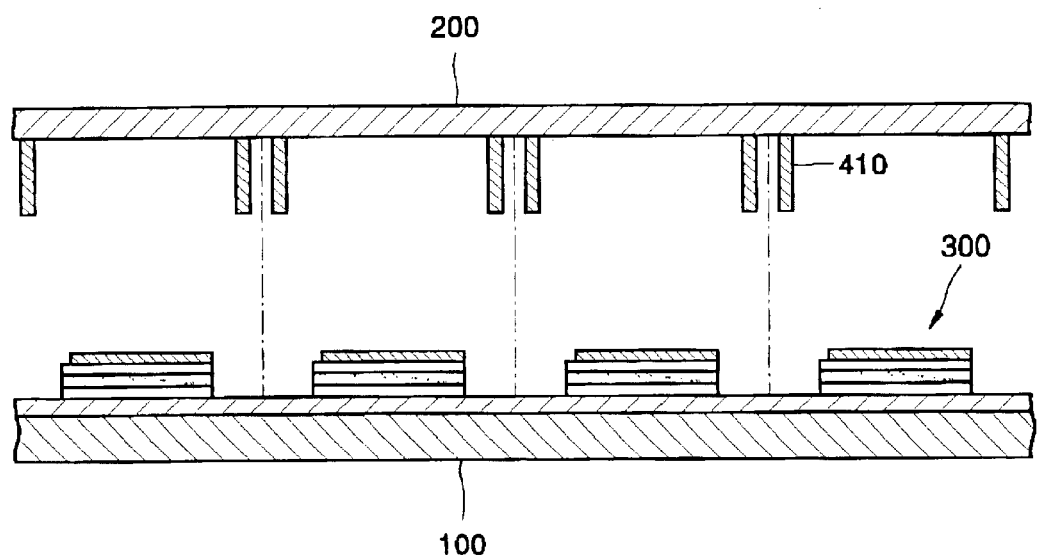

As shown in FIG. 3B, an encapsulation plate 200 is prepared for encapsulating each of the organic EL devices 300 formed on the substrate 100. Then, a first sealant 410 is applied to a portion of the encapsulation plate 200 facing the substrate 100 to define one region for an EL device selected from the organic EL devices 300 on the substrate 100. The first sealant 410 serves as a barrier for defining the selected organic EL device from the other organic EL devices 300. The encapsulation plate 200 can be made from a metallic material. Also, the encapsulation plate 200 can be made from a transparent material, e.g., glass, so that light from the light emitting layer 330 passes through the encapsulation plate 200. Alternatively, in order to prevent moisture from infiltrating through the encapsulation plate 200, the encapsulation plate 200 can be made from a plastic film having a moisture protecting film on its surface.

Figure 3C:
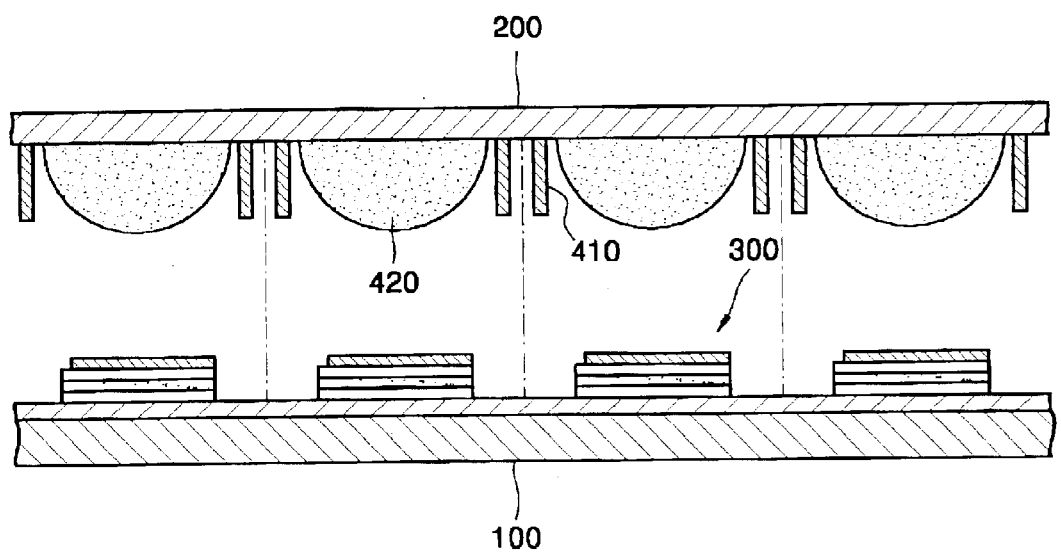

As shown in FIG. 3C, a space produced by the encapsulation plate 200 and the first sealant 410 and having one open face is filled with a second sealant 420. The first sealant 410 serves as a barrier while maintaining its shape even if the space is filled with the second sealant 420. The first sealant 410 is preferably formed of a highly viscous material. Before curing, the viscosity is preferably from about 100,000 CP (Centi-Poise) to about 400,000 CP. The first sealant 410 may include, but is not limited to, curable monomers or oligomers such as XNR5516 series (Nagase ChemTex, 8723 Series (Kyoritsu Chem), XUC series (Mitsui), and 30Y-437 (Three Bond). In certain preferred embodiments XNR5516HV from Nagase ChemTex is used as the first sealant.

The second sealant 420 fills the space produced by the first sealant 410 and is formed of a material having a lower viscosity than the first sealant 410. The second sealant 420 functions as a hydrophobic liquid layer or solid layer and is preferably chemically unreactive and physically stable in the organic EL device. Preferably, the viscosity of the second sealant before curing, is preferably from about 1 CP to about 100,000 CP. The second sealant 420 may be from hydrophobic oils, silicons, or epoxy-based adhesives known to those skilled in the art including, but not limited to, curable monomers or oligomers such as AHS 478 series (3M), XNR5516 series (Naqase ChemTex), 8723 series (Kyoritsu Chem), inert liquids such as Demnum (Sumitomo), Fluorinert (3M) and liquid crystals. In certain preferred embodiments, the curable monomers or oligomers are epoxy-based adhesives that cure when exposed to ultraviolet or visible light, have viscosities ranging from about 500 CP to about 300,000 CP, and glass transition temperatures ranging from about 80° C. to about 160° C. In other embodiments, the inert liquid is a commercially available product and preferably has a molecular weight ranging from about 300 to about 5,000, a vapor pressure ranging from about $10^{-2}$ to about $10^{-5}$ torr at 25° C., and a boiling point ranging from about 60° C. to about 300° C. The second sealant 420 is preferably resistant to humidity and transparent. A transparent second sealant 420 allows light emanating from the light emitting layer 330 to be emitted to the encapsulation plate 200 as well as the substrate 100. The second sealant may be deposited by a syringe, spin coating, spray coating, and other similar methods. Here, the encapsulation plate 200 is formed of a transparent material such as glass, and the second electrode layer 350 is a transparent electrode, like the first electrode layer 310 made of an indium-tin oxide (ITO) layer.

Figure 3D:
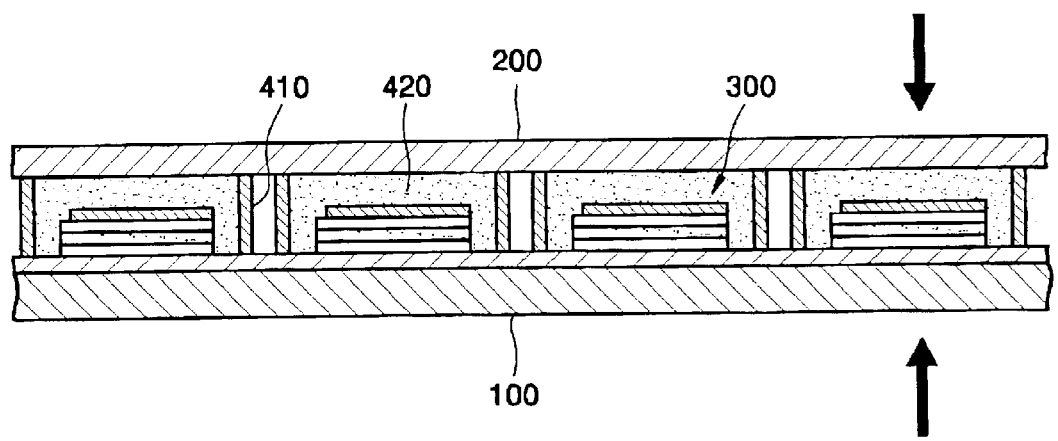

As shown in FIG. 3D, if pressure is applied to the substrate 100 and the encapsulation plate 200 in opposite directions, the substrate 100 and the encapsulation plate 200 are bonded together by the first sealant 410 and second sealant 420 coated on the encapsulation plate 200, and the organic EL device 300 formed on the substrate 100 is covered by the second sealant 420. In order to prevent oxygen or moisture from infiltrating into the organic EL device 300 while applying pressure to the substrate 100 and the encapsulation plate 200, the pressure to the substrate 100 and the encapsulation plate 200 may be applied in vacua or under a $N_2$ or Ar atmosphere. It is preferable to apply pressure in vacua.

Figure 3E:
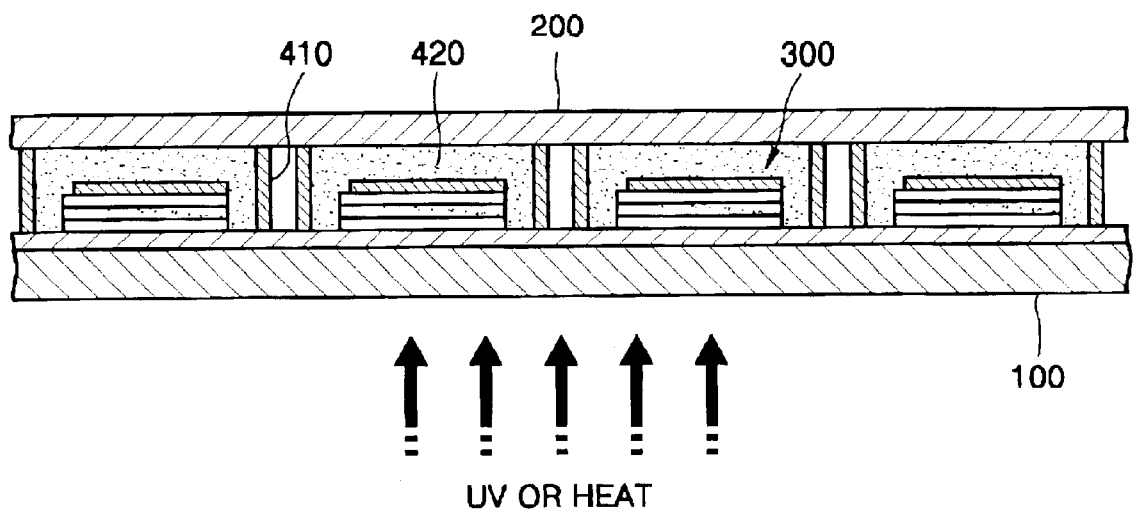

As shown in FIG. 3E, the first and second sealants 410 and 420 which bond the substrate 100 with the encapsulation plate 200, are cured. The first and second sealants 410 and 420 may be thermally curable sealants that are cured by heat or may be photo-curable sealants that are cured when they are exposed to UV or visible rays from a suitable source, such as a 50–150 mW/cm² powered lamp.

Figure 3F:
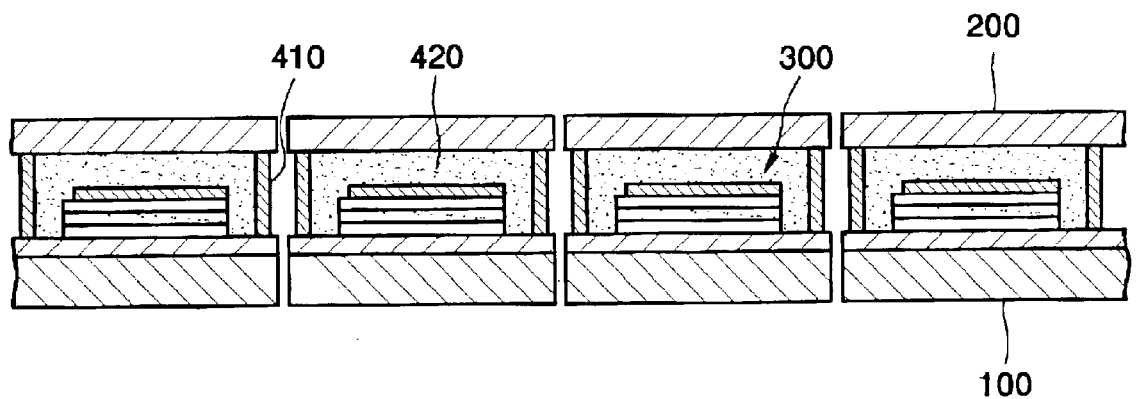

Finally, as shown in FIG. 3F, after the first sealant 410 and second sealant 420 are cured, the substrate 100 and the encapsulation plate 200 are cut so as to include the respective organic EL device 300 defined and selected by the first sealants 410, thereby fabricating a plurality of organic EL device panels.

According to the encapsulation method of the first embodiment of the present invention, as shown in FIGS. 3A through 3F, before applying the second sealant 420 to the encapsulation plate 200, the first sealant 410 having a higher viscosity than the second sealant 420 is applied to the encapsulation plate 200 to clearly define areas to be coated with the second sealant 420. Thus, there is no probability of erroneously applying the second sealant 420 to the electrode parts that are to remain exposed. Also, compressive bonding of the substrate 100 and the encapsulation plate 200 in vacua or under a $N_2$ or Ar atmosphere prevents bubbles from generating between the second sealant 420 and the encapsulation plate 200. Accordingly, the method of the present invention removes burdensomes steps such as filling a void of around the EL device with an inert gas or removing resin from erroneously coated electrode parts. Thus, the method of the present invention reduces defect ratio and enhances the manufacturability.

A second embodiment of the present invention will now be described in detail with reference to the accompanying drawings.

FIGS. 4A through 4F are longitudinal cross-sectional views illustrating another method for encapsulating an organic EL device. Like wherein like reference numerals refer to the like elements in the first embodiment, and an explanation of the same function and operation will not be repeated.

Figure 4A:
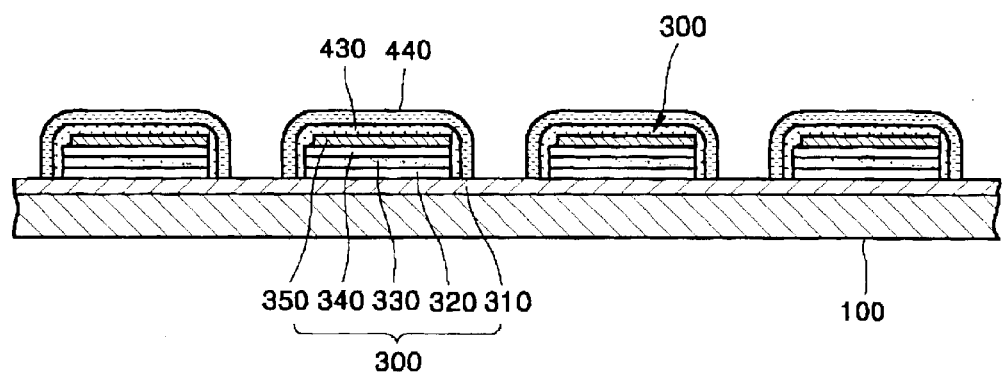
FIGS. 4A through 4F are longitudinal cross-sectional views illustrating a method for encapsulating an organic EL device according to a second embodiment of the present invention.
Figure 4B:
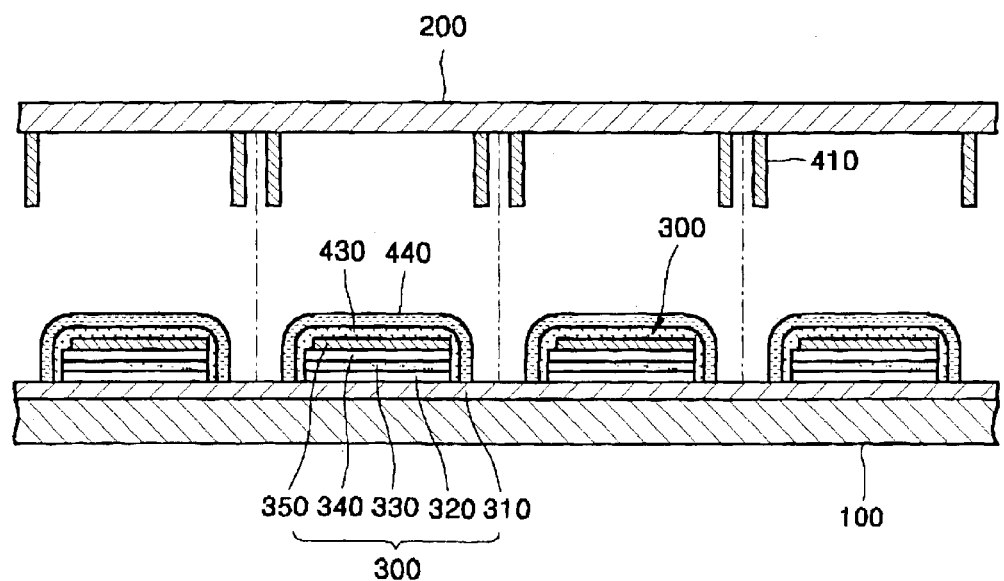
Figure 4C:
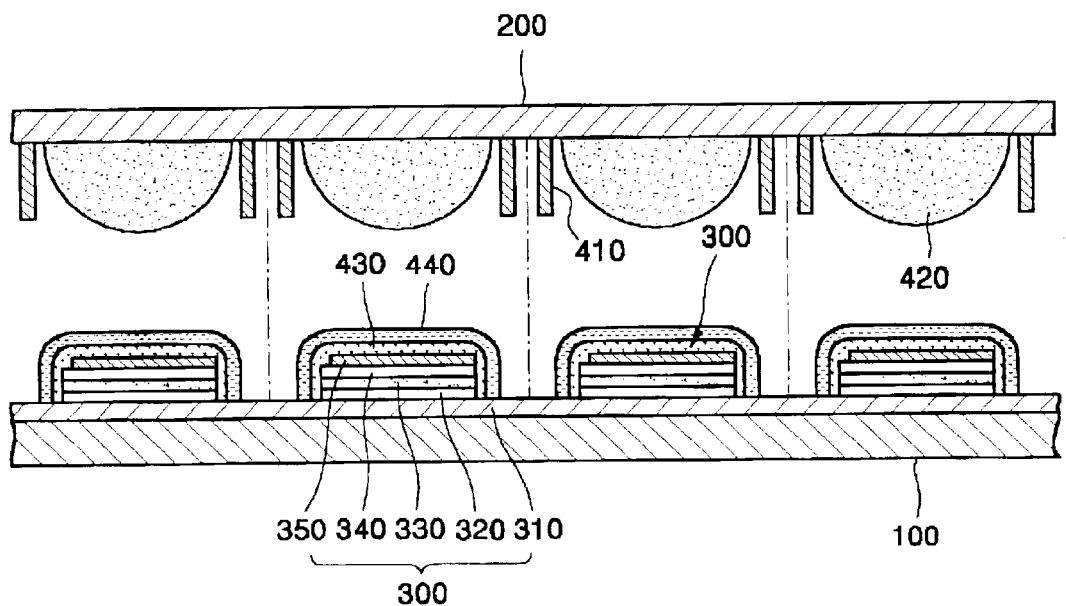
Figure 4D:
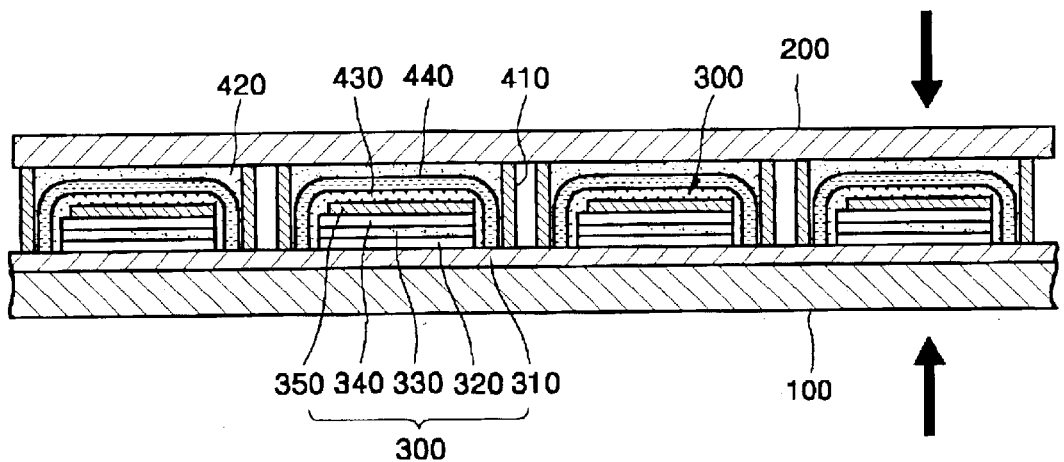
Figure 4E:
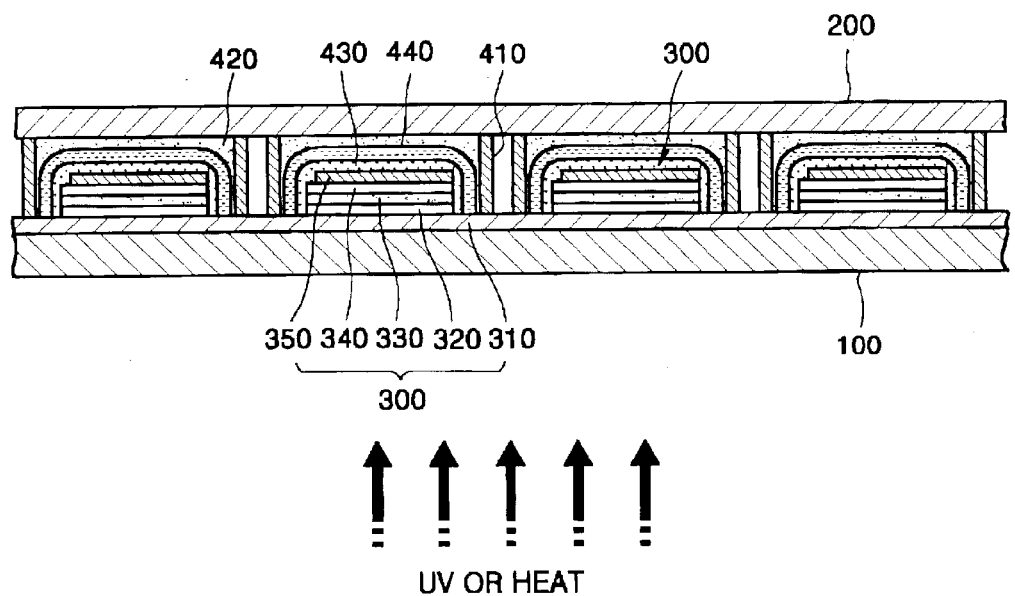
Figure 4F:
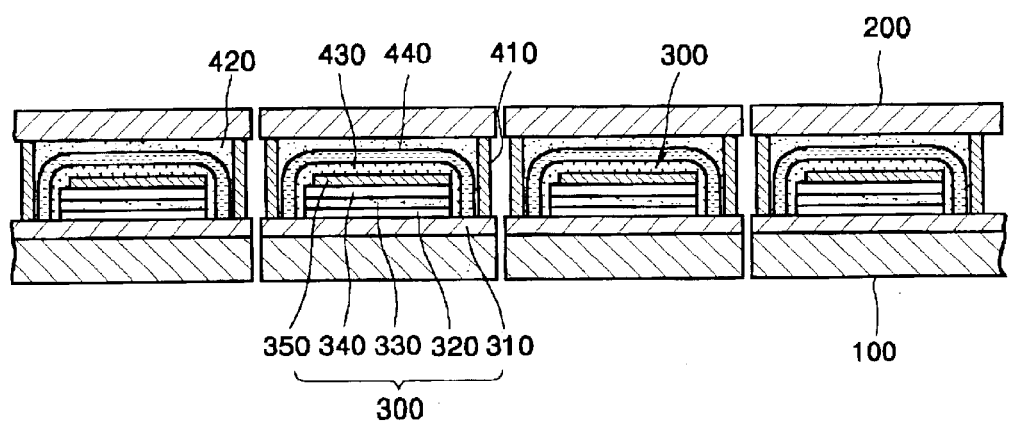

Referring to FIG. 4A, in order to effectively prevent oxygen and moisture from infiltrating into a plurality of organic EL devices 300 formed on a substrate 100, each including a first electrode layer 310, organic layers 320, 330 and 340, and a second electrode layer 350, an inorganic material is applied onto the organic EL device 300 to form an inorganic material layer 430. Thereafter, an organic material is applied onto the inorganic material layer 430 to form an organic material layer 440. Here, in order to allow light emanating from the light emitting layer 330 to be emitted to the encapsulation plate 200 as well as the substrate 100, the inorganic material layer 440 can be formed of at least one transparent material selected from silicon oxide ($SiO_x$) and silicon nitride ($SiN_x$).

As shown in FIGS. 4B through 4F, a plurality of independent organic EL panels are fabricated in substantially the same manner as in the first embodiment.

According to the encapsulation method of the second embodiment of the present invention, as shown in FIG. 4A, the inorganic material layer 430 and the organic material layer 440 are stacked on the organic EL device 300, thereby effectively preventing oxygen or moisture from infiltrating into the organic EL device 300.

As described above, according to the encapsulation method of the present invention, it is not necessary to perform burdensome steps, e.g., filling gas such as nitrogen after encapsulating the organic EL device, or removing the second sealant in order to expose the erroneously coated electrode parts. Thus, manufacturability is enhanced. Also, compressive bonding of the substrate and the encapsulation plate in vacua or under a $N_2$ or Ar atmosphere prevents bubbles from generating between the second sealant and the encapsulation plate, reducing the defect ratio.

EXAMPLE

An organic EL device was fabricated by sequentially depositing an anode formed of an ITO layer, a hole injection layer formed of IDE406, a hole transporting layer formed of IDE320, an emitting layer formed of CBP:Irppy, a hole blocking layer formed of Balq and a cathode layer formed of aluminum. An inert liquid layer was formed on the cathode layer.

The organic EL device was evaluated with and without a second sealant by measuring the growth of dark spots, i.e. the non-emmision area ratio, with the passage of time by microscopy. Measurements were taken at a brightness of 100 $cd/m^2$. Table 1 shows the non-emmision area ratio measurements for 0 to 45 days for EL devices with and without a second sealant.

TABLE 1

| | Non Emission Area Ratio (%) | | | | | |
|---|---|---|---|---|---|---|
| The Passage of Time | Without Second Sealant | AHS 478 LV1 | XNR 5516 HP | 8723L | Dennum S-65 | Fluorinert EGC-1700 |
| Initial | 0.1 | 0.1 | 0.1 | 0.1 | 0.1 | 0.1 |
| 1 day | 0.1 | 0.1 | 0.1 | 0.1 | 0.1 | 0.1 |
| 5 days | 0.2 | 0.1 | 0.2 | 0.2 | 0.3 | 0.2 |
| 10 days | 0.5 | 0.1 | 0.3 | 0.3 | 0.5 | 0.2 |
| 20 days | 0.8 | 0.2 | 0.6 | 0.6 | 0.7 | 0.7 |
| 30 days | 1.1 | 0.3 | 1.0 | 0.9 | 0.9 | 1.0 |
| 45 days | 1.5 | 0.5 | 1.3 | 1.3 | 1.2 | 1.2 |

The organic EL devices with a second sealant typically showed improved non-emission area ratios compared to organic EL devices without the second sealant.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method of encapsulating an organic electroluminescent (EL) device comprising steps of:

applying a first sealant to a portion of an encapsulation plate facing a substrate that defines one selected from a plurality of organic EL devices formed on the substrate, each EL device including a first electrode layer, an organic layer, and a second electrode layer;

filling with a second sealant a space produced by the encapsulation plate and the first sealant and having an open face; and bonding the substrate and the encapsulation plate together by applying pressure such that the first sealant and the second sealant bond the substrate and the encapsulation plate to each other.

2. The method of claim 1, further comprising steps of:

curing the first sealant and the second sealant; and cutting the substrate and the encapsulation plate so as to the selected organic EL device into a plurality of independent organic EL panels.

3. The method of claim 1, wherein the viscosity of the first sealant, before curing, is from about 100,000 CP (Centi-Poise) to about 400,000 CP, and that of the second sealant is from about 1 CP to about 100,000 CP.

4. The method of claim 1, wherein the first sealant and the second sealant are thermally curable.

5. The method of claim 1, wherein the first sealant and the second sealant are photo-curable, when exposed to UV or visible rays.

6. The method of claim 1, wherein the encapsulation plate and the second sealant are formed of transparent materials, and the first electrode layer and the second electrode layer are transparent.

7. The method of claim 1, wherein the encapsulation plate is formed of a plastic film having a moisture protecting layer on its surface.

8. The method of claim 1, wherein the second sealant is formed of a material selected from the group consisting of hydrophobic oils and silicons.

9. The method of claim 1, wherein the bonding step is performed in vacua.

10. The method of claim 1, wherein the bonding step is performed under a nitrogen atmosphere.

11. The method of claim 1, wherein the bonding step is performed under an argon atmosphere.

12. A method for encapsulating an organic electroluminescent (EL) device, comprising steps of:

forming an inorganic material layer by stacking an inorganic material on a plurality of organic EL devices formed on a substrate, each including a first electrode layer, an organic layer, and a second electrode layer;

forming an organic material layer by stacking on an organic material on the inorganic material layer;

applying a first sealant to a portion of an encapsulation plate facing the substrate to define one selected from the plurality of organic EL devices;

filling with a second sealant a space produced by the encapsulation plate and the first sealant and having an open face; and bonding the substrate and the encapsulation plate together by applying pressure such that the first sealant and the second sealant bond the substrate and the encapsulation plate to each other.

13. The method of claim 12, further comprising steps of:

curing the first sealant and second sealant; and cutting the substrate and the encapsulation plate so as to the selected organic EL device into a plurality of independent organic EL panels.

14. The method of claim 12, wherein the inorganic material layer is formed of a material selected from silicon oxides.

15. The method of claim 12, wherein the inorganic material layer is formed of a material selected from silicon nitrides.

16. The method of claim 12, wherein the encapsulation plate and the second sealant are formed of transparent material and the first electrode layer and the second electrode layer are transparent.

* * * * *